US012635562B2

(12) United States Patent
Niwa et al.

(10) Patent No.: US 12,635,562 B2
(45) Date of Patent: May 19, 2026

(54) SEMICONDUCTOR DEVICE AND SEMICONDUCTOR DEVICE MANUFACTURING METHOD

(71) Applicant: Kioxia Corporation, Tokyo (JP)

(72) Inventors: Keiichi Niwa, Yokkaichi Mie (JP);
Yoshiaki Goto, Kiyosu Aichi (JP)

(73) Assignee: Kioxia Corporation, Tokyo (JP)

( * ) Notice: Subject to any disclaimer, the term of this patent is extended or adjusted under 35 U.S.C. 154(b) by 645 days.

(21) Appl. No.: 17/691,749

(22) Filed: Mar. 10, 2022

(65) Prior Publication Data

US 2023/0022159 A1 Jan. 26, 2023

(30) Foreign Application Priority Data

Jul. 15, 2021 (JP) ................................. 2021-117108

(51) Int. Cl.
H01L 25/065 (2023.01)
H01L 23/433 (2006.01)
(Continued)

(52) U.S. Cl.
CPC ......... H10W 90/00 (2026.01); H10W 40/778 (2026.01); H10W 90/288 (2026.01);
(Continued)

(58) Field of Classification Search
CPC ....... H01L 2225/06589; H01L 25/0657; H01L 2225/06541
See application file for complete search history.

(56) References Cited

U.S. PATENT DOCUMENTS 5,923,084 A 7/1999 Inoue et al.
6,737,750 B1 * 5/2004 Hoffman ............... H01L 23/552
257/777
(Continued)

FOREIGN PATENT DOCUMENTS

CN 110729176 A 1/2020
JP 858052859 A 3/1983
(Continued)

OTHER PUBLICATIONS

The Engineering ToolBox (2003). Solids, Liquids and Gases— Thermal Conductivities. [online] Available at: https://www. engineeringtoolbox.com/thermal-conductivity-d_429.html [Accessed Sep. 27, 2024]. (Year: 2003).*
(Continued)

*Primary Examiner* — Britt Hanley
*Assistant Examiner* — Jason James Greaving
(74) *Attorney, Agent, or Firm* — Holtz, Holtz & Volek PC

(57) ABSTRACT

A semiconductor device includes: a substrate on which wiring is formed; a first semiconductor element flip-chip bonded to the substrate; a second semiconductor element provided on the first semiconductor element; a first resin provided in at least part of a region between the first semiconductor element and the substrate; a second resin provided in at least part of a region between the second semiconductor element and the substrate; and a member having a thermal conductivity higher than a thermal conductivity of the first resin and a thermal conductivity of the second resin, provided between the first resin and the second resin, having a part overlapping with an upper surface of the first semiconductor element, and having another part overlapping with a first wiring part as part of the wiring in a top view.

14 Claims, 11 Drawing Sheets

(51) Int. Cl.

| | |
|---|---|
| *H01L 25/00* | (2006.01) |
| *H01L 25/18* | (2023.01) |
| *H10W 40/77* | (2026.01) |
| *H10W 90/00* | (2026.01) |
| *H10W 90/20* | (2026.01) |

(52) U.S. Cl.

CPC ........ *H10W 90/291* (2026.01); *H10W 90/724* (2026.01); *H10W 90/754* (2026.01)

(56) References Cited

U.S. PATENT DOCUMENTS

| | | | | |
|---|---|---|---|---|
| 6,800,931 | B2 * | 10/2004 | Tsuda | H01L 23/36 |
| | | | | 257/E23.101 |
| 8,853,851 | B2 | 10/2014 | Ihara | |
| 9,230,876 | B2 | 1/2016 | Lee et al. | |
| 2004/0125578 | A1 | 7/2004 | Konishi et al. | |
| 2006/0267188 | A1 * | 11/2006 | Ishino | H01L 25/0657 |
| | | | | 257/723 |
| 2007/0075413 | A1 * | 4/2007 | Egawa | H01L 21/6835 |
| | | | | 257/E21.705 |
| 2011/0079902 | A1 | 4/2011 | Sakamoto et al. | |
| 2011/0316131 | A1 | 12/2011 | Fukuda et al. | |
| 2015/0155218 | A1 * | 6/2015 | Hung | H01L 23/49827 |
| | | | | 257/713 |
| 2015/0259194 | A1 * | 9/2015 | Lin | H01L 25/105 |
| | | | | 257/773 |
| 2021/0066249 | A1 | 3/2021 | Niwa | |
| 2021/0118770 | A1 | 4/2021 | Kuo et al. | |
| 2021/0233830 | A1 * | 7/2021 | Oka | H01L 23/367 |

FOREIGN PATENT DOCUMENTS

| | | |
|---|---|---|
| JP | H07169869 A | 7/1995 |
| JP | 109055459 A | 2/1997 |
| JP | H10200018 A | 7/1998 |
| JP | 2002026178 A | 1/2002 |
| JP | 2004214249 A | 7/2004 |
| JP | 2012009726 A | 1/2012 |
| JP | 2015117311 A | 6/2015 |
| JP | 2019006837 A | 1/2019 |
| JP | 2020102477 A | 7/2020 |
| TW | 202109687 A | 3/2021 |
| TW | 202117983 A | 5/2021 |

OTHER PUBLICATIONS

The Engineering ToolBox (2005). Metals, Metallic Elements and Alloys—Thermal Conductivities. [online] Available at: https://www.engineeringtoolbox.com/thermal-conductivity-metals-d_858.html [Accessed Sep. 27, 2024]. (Year: 2005).*

* cited by examiner

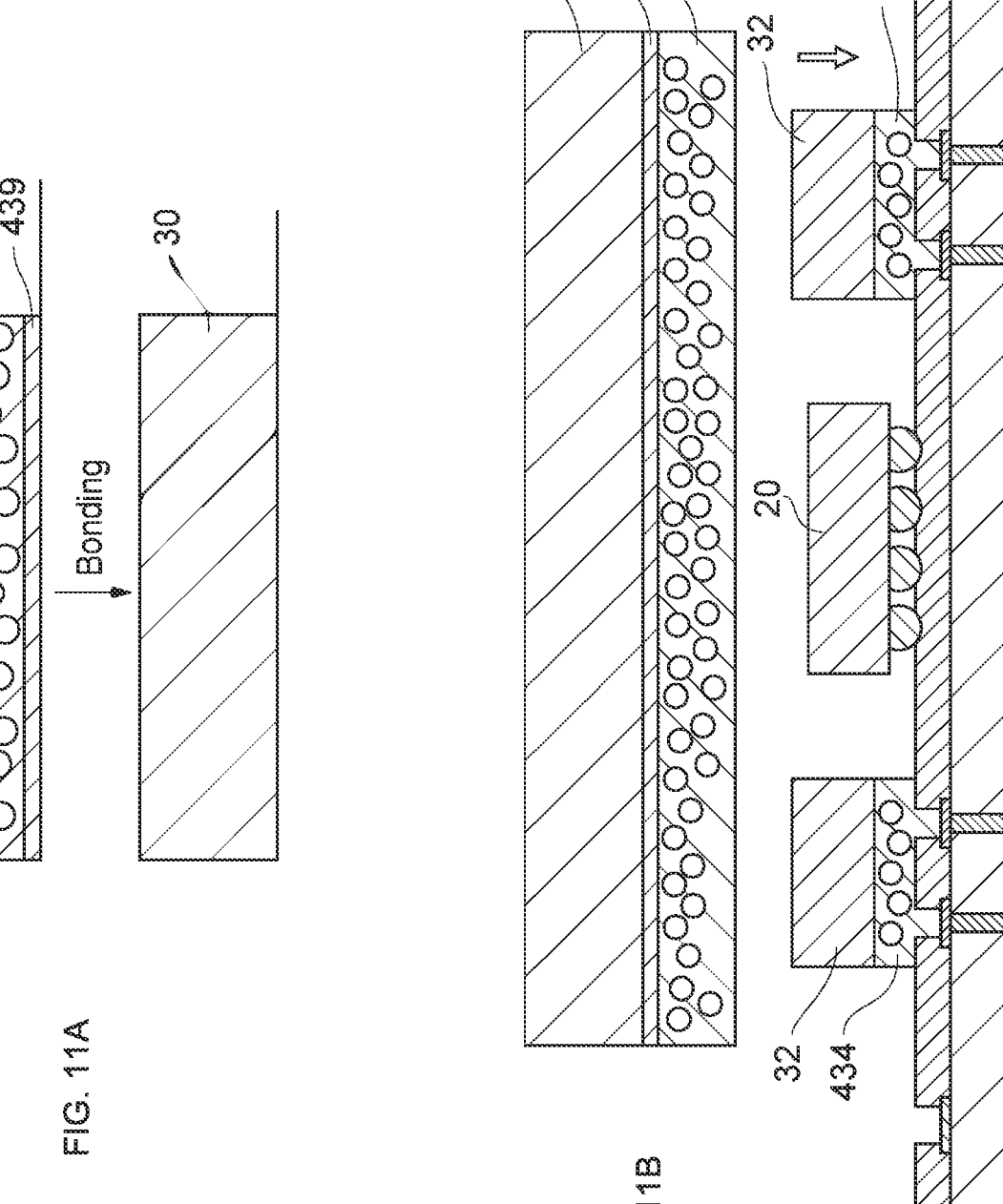

SEMICONDUCTOR DEVICE AND SEMICONDUCTOR DEVICE MANUFACTURING METHOD

CROSS-REFERENCE TO RELATED APPLICATION

This application is based upon and claims the benefit of priority from Japanese Patent Application No. 2021-117108, filed on Jul. 15, 2021, the entire contents of which are incorporated herein by reference.

BACKGROUND OF THE INVENTION

Field of the Invention

The present disclosure relates to a semiconductor device and a semiconductor device manufacturing method.

Description of the Related Art

For example, a semiconductor device in which a semiconductor memory and a memory controller are packaged is known. In such a semiconductor device, as the operation speed of the semiconductor memory increases, the amount of heat generation at the memory controller increases, and accordingly, the temperature of the memory controller potentially becomes high enough to stop operation. A configuration for effective heat releasing is desired particularly for a semiconductor device including flip-chip bonded semiconductor elements from which heat releasing is not easy.

BRIEF DESCRIPTION OF THE DRAWINGS

FIG. 7 is a schematic diagram illustrating a section of a semiconductor memory device 110 in a side view;

FIGS. 11A and 11B are schematic diagrams illustrating a process of manufacturing the semiconductor memory device 410.

DETAILED DESCRIPTION OF THE PREFERRED EMBODIMENTS

Figure 1:
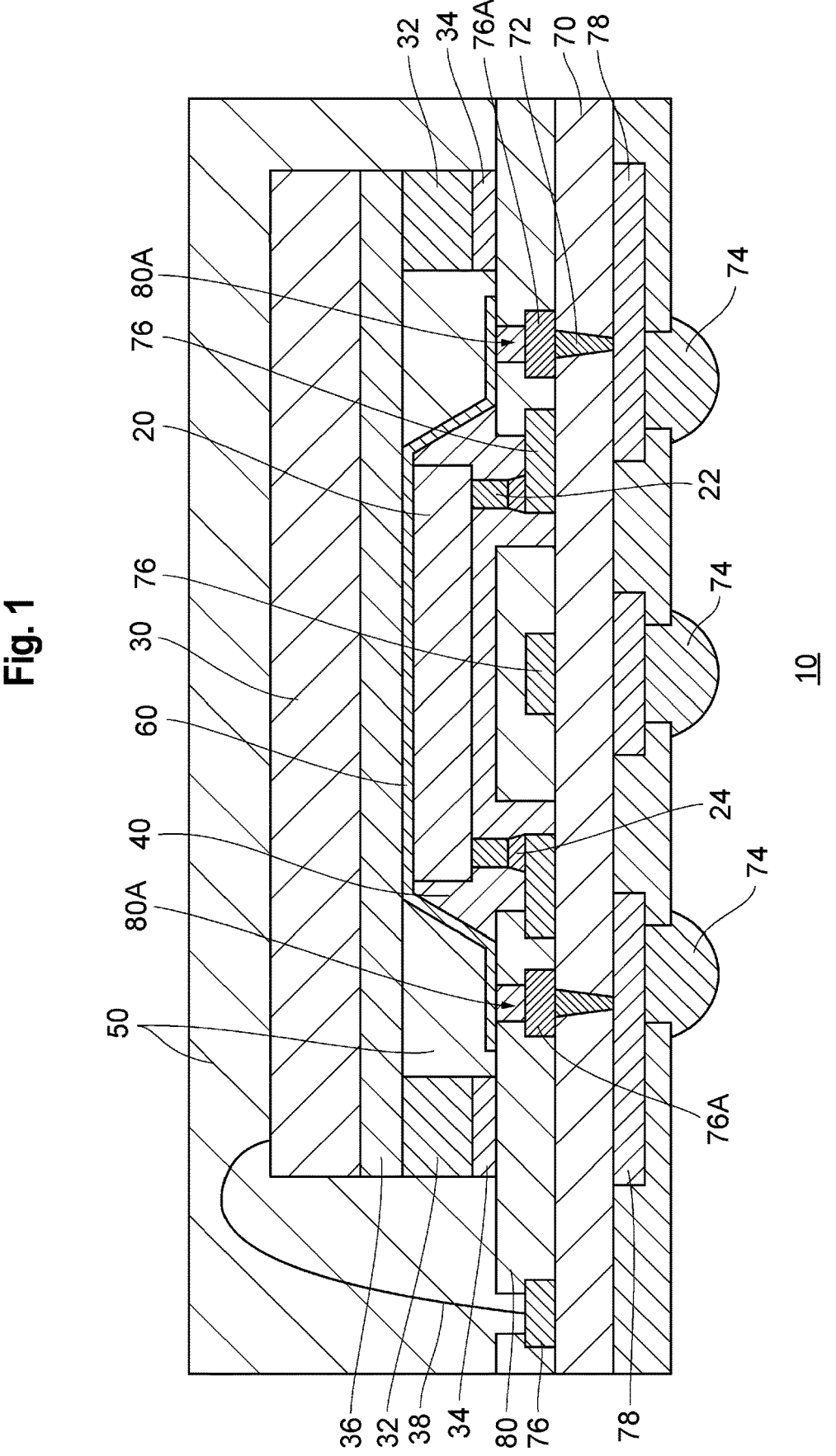
FIG. 1 is a schematic diagram illustrating a section of a semiconductor device according to an embodiment in a side view.

The present embodiment will be described below with reference to the accompanying drawings. To facilitate understanding of the description, identical constituent components in the drawings are denoted by the same reference sign whenever possible, and duplicate description thereof is omitted.

First Embodiment

The configuration of a semiconductor memory device 10 (an example of "semiconductor device") according to the present embodiment will be described below.

Figure 2:
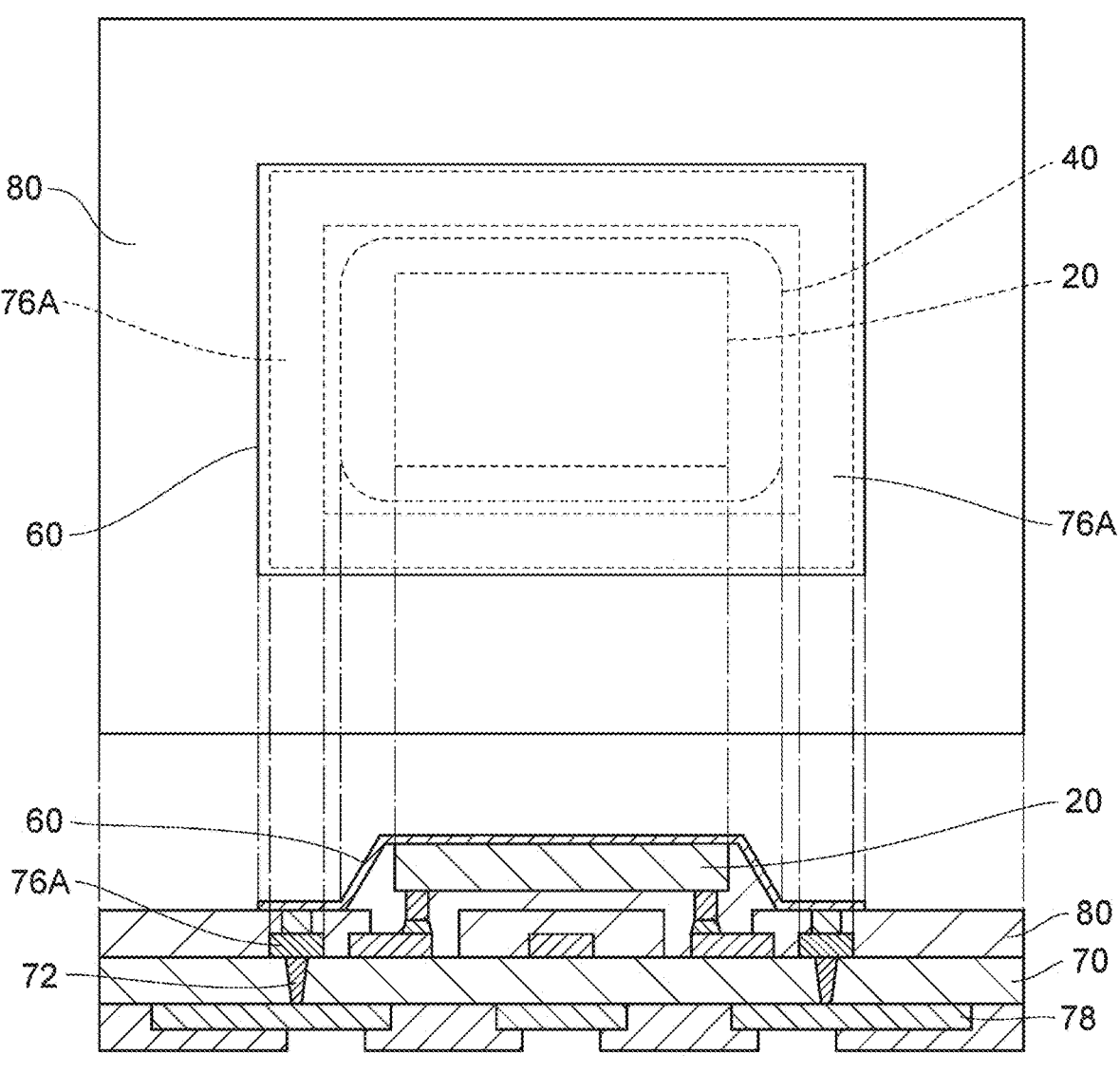
FIG. 2 is a schematic diagram illustrating sections of a configuration according to the embodiment in a top view and a side view when a first semiconductor element is flip-chip bonded to a wiring substrate.

FIG. 1 is a schematic diagram illustrating a section of the semiconductor memory device 10 in a side view, and FIG. 2 is a schematic diagram illustrating cross-sectional views of the semiconductor memory device 10 in a top view and a side view when a memory controller chip 20 (an example of "first semiconductor element"; hereinafter also referred to as a controller 20) is flip-chip bonded to a wiring substrate 70 (an example of "substrate").

The semiconductor memory device 10 includes the wiring substrate 70 on which wiring 76 is formed, the controller 20 flip-chip bonded to the wiring substrate 70, a memory chip 30 (an example of "second semiconductor element"; hereinafter also referred to as a memory 30) provided on the controller 20, an underfill fillet 40 (an example of "first resin"; hereinafter also referred to as an underfill 40) provided in a region including a region between the controller 20 and the wiring substrate 70, and a molding resin 50 (an example of "second resin") provided in a region including a region between the memory 30 and the wiring substrate 70. In addition, a heat-releasing sheet 60 (an example of "member") is provided between the underfill 40 and the molding resin 50 in the semiconductor memory device 10.

The heat-releasing sheet 60 is provided so that part thereof overlaps with at least part of an upper surface of the controller 20 in a top view. As illustrated in FIGS. 1 and 2, the heat-releasing sheet 60 in the present embodiment is provided over the entire upper surface of the controller 20.

The heat-releasing sheet 60 is also provided so that another part thereof overlaps with a first wiring part 76A as part of the wiring 76 in a top view. As illustrated in FIGS. 1 and 2, the heat-releasing sheet 60 in the present embodiment is provided so that another part thereof is connected to the first wiring part 76A.

Note that the first wiring part 76A only needs to be able to release heat and thus does not necessarily need to be connected to wiring for transmitting and receiving signals. The first wiring part 76A may be connected to wiring (an example of "power source line") for supplying a reference potential such as Vcc or Vss. The first wiring part 76A may be additionally connected to a wiring region (also referred to as a solid region) formed in a two-dimensional planar shape extending in a direction parallel to a front surface of the wiring substrate 70. In the present embodiment, the first wiring part 76A is connected to a two-dimensional wiring region 78 formed on a lower surface of the wiring substrate 70 to a back surface thereof and is connected to a ball electrode 74 as a non-connection (NC) terminal through a through hole 72.

As described above, the semiconductor memory device 10 is a semiconductor memory device as a package in which a mixed chip on which one or a plurality of memories 30 of a NAND flash type are stacked on the controller 20. The semiconductor memory device 10 has a spacer structure in which the memory 30 is supported by one or a plurality of spacers 32 as described later. Any other semiconductor element such as a DRAM or an LSI may be mounted on the semiconductor memory device 10.

The controller 20 controls information writing to the memory 30 and information reading from the memory 30. The controller 20 is made of, for example, a silicon substrate and is a semiconductor element having a largest heat generation amount in the semiconductor memory device 10. A plurality of electrodes 22 and 24 arranged in an array are formed on a lower surface of the controller 20. Each electrode 24 is formed at an end part of a corresponding one of the electrodes 22. The electrodes 22 may contain Ni, Cu, or the like, and the electrodes 24 may contain Sn or Au. The electrodes 22 and 24 may be bump electrodes. The plurality of bump electrodes 22 and 24 are connected to the wiring 76 of the wiring substrate 70, and accordingly, the controller 20 is flip-chip bonded to the wiring substrate 70. The controller 20 functions as mediation between the memory 30 and an external host device and thus is called an interface chip in some cases. Any semiconductor circuit connected to the bump electrodes 22 and 24 is formed on the lower surface of the controller 20.

The memory 30 is a semiconductor memory of a NAND flash type, which is made of, for example, a silicon substrate. The memory 30 is formed larger than the controller 20 in a top view. To increase storage capacity, the semiconductor memory device 10 may include, for example, a plurality of memories 30 stacked in a stepped manner. The semiconductor memory device 10 may include a wire 38 connecting an electrode formed on an upper surface of the memory 30 and an electrode formed on an upper surface of the wiring substrate 70 to the front surface thereof. The semiconductor memory device 10 may include a plurality of memories 30 connected through a through-silicon via (TSV).

The semiconductor memory device 10 includes the one or a plurality of spacers 32 for supporting the memory 30, and a bonding film 34 for bonding each spacer 32 to a solder resist 80, and further includes a die attach film (DAF) 36 provided on the spacers 32 and the controller 20. In the present embodiment, since the upper surface of the controller 20 is covered by the heat-releasing sheet 60, the DAF 36 has a lower surface bonded to an upper surface of the spacer 32 and an upper surface of the heat-releasing sheet 60 and has an upper surface bonded to a lower surface of the memory 30, thereby supporting the memory 30. Note that the bonding film 34 may be a die attach film (DAF).

The underfill 40 is a resin that fills a space among a plurality of bumps of the controller 20 to reduce stress of the controller 20 on the bumps. The underfill 40 in the present embodiment is formed in accordance with the shape of an attachment 94 (FIG. 6) used at manufacturing to be described later, and thus is formed so that the underfill 40 covers a side surface of the controller 20 and an upper surface of the underfill 40 around the controller 20 and includes a portion (also referred to as a shoulder portion) having a height substantially equal to that of the upper surface of the controller 20. However, the present invention is not limited to the shape of the underfill 40 in the present embodiment. For example, the underfill 40 may be a resin provided in at least part of the region between the controller 20 and the wiring substrate 70 and having another shape that fills a space among the bump electrodes of the controller 20.

Note that, as described later, the underfill 40 spreads to the outside of the heat-releasing sheet 60 in some cases. In such a case, the underfill 40 spreading to the outside of the heat-releasing sheet 60 potentially moves up on the outside of the heat-releasing sheet 60 so that potentially the underfill 40 is partially provided on the outside and inside of the heat-releasing sheet 60.

The molding resin 50 is a resin for sealing the controller 20 and the memory 30 and is a thermosetting resin such as epoxy resin. In the present embodiment, the controller 20 is disposed in a region covered by the heat-releasing sheet 60. Accordingly, the molding resin 50 is provided in the region between the memory 30 and the wiring substrate 70 around the memory 30 and on the outside of the heat-releasing sheet 60. However, the molding resin 50 enters the inside of the heat-releasing sheet 60 in some cases. In such a case, the molding resin 50 is potentially partially provided on the outside and inside of the heat-releasing sheet 60. A larger number of glass fibers and inorganic particles are contained as fillers in the molding resin 50 than in the underfill 40. The molding resin 50 has an elastic modulus and a Young's modulus larger than those of the underfill 40.

The wiring substrate 70 is a single-layer or multi-layer printed wiring substrate made of, for example, a glass epoxy substrate on which a wiring pattern for performing signal transmission and reception between the controller 20 and an external device is formed.

A wiring pattern including first wiring parts 76A to which the heat-releasing sheet 60 is connected is formed on the upper surface of the wiring substrate 70. The first wiring parts 76A are wiring for releasing heat of the heat-releasing sheet 60 out of the wiring substrate 70. In the present embodiment, the first wiring parts 76A are connected to the heat-releasing sheet 60. However, the first wiring parts 76A only need to be able to release heat and thus do not necessarily need to be connected to the heat-releasing sheet 60. The first wiring parts 76A in the present embodiment are formed around the controller 20 in a top view as illustrated in FIG. 2. However, as described later, the first wiring parts 76A do not necessarily need to be formed around the controller 20 but only needs to be formed at part of the upper surface of the wiring substrate 70. However, the first wiring parts 76A are preferably provided on the outside of the controller 20 in a top view. With such a configuration, the first wiring parts 76A can be easily positioned close to the heat-releasing sheet 60.

A plurality of ball electrodes 74 arranged in an array for connection to a mounting substrate are formed on a back surface of the wiring substrate 70 to the lower surface thereof. The ball electrodes 74 include a ball electrode 74 as an NC terminal to which the heat-releasing sheet 60 is electrically connected as described above.

In addition, the two-dimensional wiring region 78 electrically connected to the first wiring parts 76A and extending in the direction parallel to the front surface of the wiring substrate 70 is formed on the lower surface of the wiring substrate 70. Heat releasing can be promoted by providing the wiring region 78. However, the wiring region 78 may be formed as an inner layer of the wiring substrate 70.

In addition, through holes 72 (examples of "second wiring part") for connecting the first wiring parts 76A to the ball electrodes 74 on the lower surface are formed through the wiring substrate 70. Each through hole 72 is constituted by a through hole penetrating through the wiring substrate 70, and wiring formed on an inner wall of the through hole. However, each first wiring part 76A may be connected to the corresponding ball electrode 74 on the lower surface through a via or the like that does not penetrate through the wiring substrate 70.

The solder resist 80 for protecting the wiring substrate 70 is provided on each of the upper and lower surfaces of the wiring substrate 70. An opening 80A through which at least part of a corresponding first wiring part 76A is exposed upward is formed at the solder resist 80. In the present embodiment, the openings 80A are formed around the controller 20 in regions overlapping with the respective first wiring parts in a top view as illustrated in FIG. 2. The heat-releasing sheet 60 is connected to each first wiring part 76A through the corresponding opening 80A. Each first wiring part 76A includes an exposed part that is exposed from the solder resist 80 through the corresponding opening 80A.

The heat-releasing sheet 60 releases, through the wiring substrate 70, heat generated by the controller 20. As described above, part of the heat-releasing sheet 60 overlaps with at least part of the upper surface of the controller 20 in a top view. Another part of the heat-releasing sheet 60 overlaps with each first wiring part 76A as part of the wiring 76 in a top view. Thus, the heat-releasing sheet 60 can discharge heat received from the controller 20 to each first wiring part 76A.

The heat-releasing sheet 60 in the present embodiment is connected to the upper surface of the controller 20 in a side view. The heat-releasing sheet 60 has a height (an example of "first height") from the front surface of the wiring substrate 70 to the upper surface of the controller 20 at a part connected to the upper surface of the controller 20, lowers closer to the front surface of the wiring substrate 70 at a position closer to each first wiring part 76A, and has a height (an example of "second height") substantially equal to that of the front surface of the wiring substrate 70 at a part connected to the first wiring part 76A. However, the heat-releasing sheet 60 does not necessarily need to be connected to the first wiring part 76A. In a case in which the heat-releasing sheet 60 is not connected to the first wiring part 76A, heat received from the controller 20 can be discharged to the first wiring part 76A by closely positioning the heat-releasing sheet 60 and the first wiring part 76A. For example, the heat-releasing sheet 60 may be provided to block each opening 80A formed through the solder resist 80.

The heat-releasing sheet 60 has a thermal conductivity higher than at least the thermal conductivity of the underfill 40 and the thermal conductivity of the molding resin 50. The heat-releasing sheet 60 preferably has a thermal conductivity equal to or higher than 10 W/m·K, more preferably has a thermal conductivity equal to or higher than 50 W/m·K. For example, the heat-releasing sheet 60 may be made of a crystalline graphite sheet of 700 W/m·K. Table 1 lists the thermal conductivities of various materials.

TABLE 1

| Material | | Thermal conductivity [W/m·K] |
| --- | --- | --- |
| Si | | 120 |
| Cu | | 403 |
| Au | | 319 |
| Al | | 236 |
| Sealing resin | | 0.5-1.0 |
| Bonding agent | | 0.2-0.4 |
| Wire | | 320 |
| Substrate | Core | 0.3-0.5 |
| | Solder resist | 0.1-0.3 |
| Ceramic | | 150 |
| SUS304 | | 16.3 |
| Solder | 63Sn37Pb | 50 |
| | Sn3.0Ag0.5Cu | 60 |
| Air | | 0.026 |

As illustrated in Table 1, a typical resin has a thermal conductivity equal to or lower than 1 W/m·K. The thermal conductivity of any resin contained in the underfill 40, the molding resin 50, the bonding film 34, and the DAF 36 according to the present embodiment is equal to or lower than 1 W/m·K. Accordingly, the heat-releasing sheet 60 has a thermal conductivity that is 10 times or more higher than the thermal conductivity of a resin disposed on the inside of the heat-releasing sheet 60 and the thermal conductivity of a resin disposed on the outside thereof.

The heat-releasing sheet 60 may not be conductive (may be insulating) or may be conductive. The heat-releasing sheet 60 that is not conductive has lower necessity for considering electric influence on the controller 20 and the memory 30 than the heat-releasing sheet 60 that is conductive, thereby allowing for increased freedom of designing. The heat-releasing sheet 60 that is conductive can be connected to wiring that has a reference potential, for example, from Vss to ground, thereby increasing stability of the reference potential.

Figures 3A, 3B, 3C:
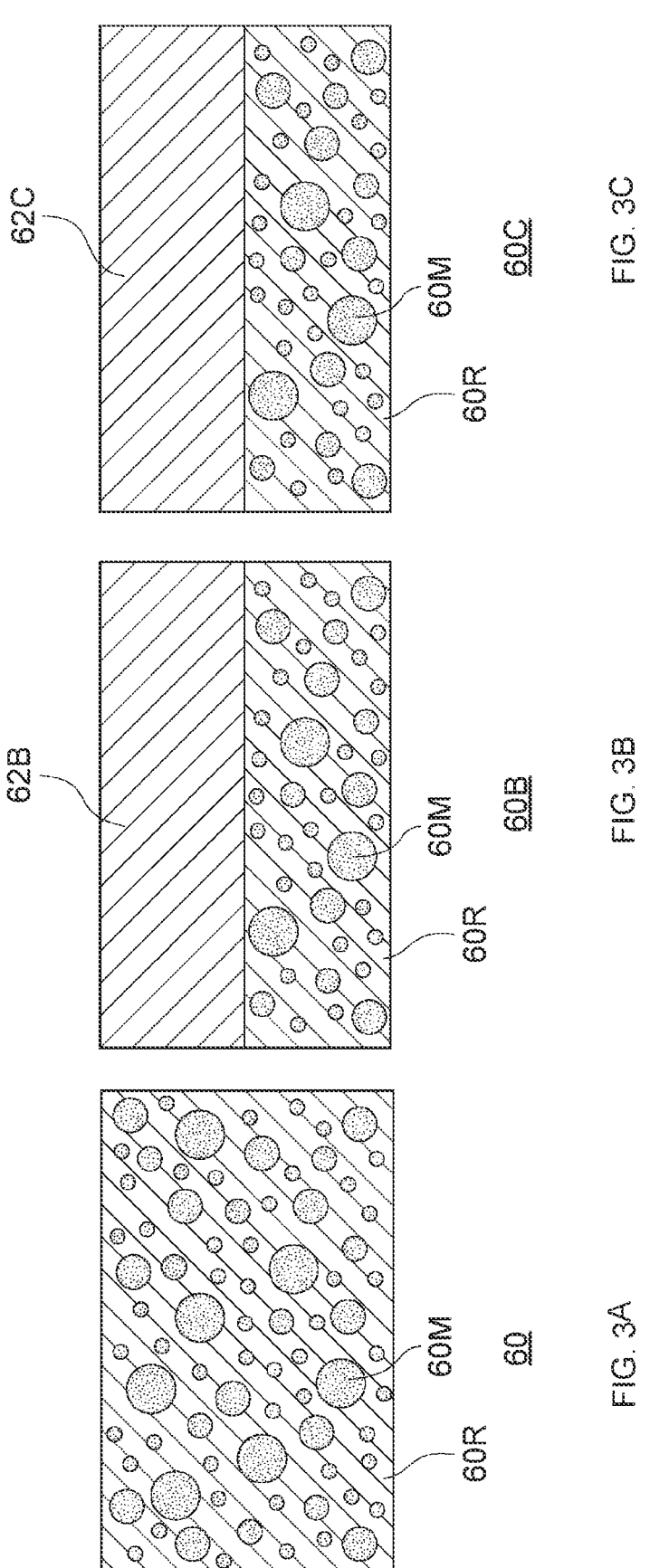
FIGS. 3A, 3B, and 3C illustrate examples of a heat-releasing sheet according to the embodiment.

FIGS. 3A, 3B, and 3C are schematic diagrams illustrating examples of the heat-releasing sheet 60 that is insulating. FIG. 3A illustrates an example of the heat-releasing sheet 60 having a single-layer structure constituted by a resin film 60R that is insulating and adhesive and in which metal powder 60M is mixed. FIG. 3B illustrates a heat-releasing sheet 60B having a double-layer structure constituted by the resin film 60R that is insulating and adhesive and in which the metal powder 60M is mixed and an inorganic material film 62B. FIG. 3C illustrates a heat-releasing sheet 60C having a double-layer structure constituted by the resin film 60R that is insulating and adhesive and in which the metal powder 60M is mixed and an organic material film 62C having a high heat-releasing property. With such a configuration, it is possible to provide a heat-releasing sheet having a thermal conductivity equal to or higher than 50 W/m·K.

In the semiconductor memory device 10 having the above-described configuration, a first heat-releasing path through the bump electrodes formed on the lower surface of the controller 20 and a second heat-releasing path through the heat-releasing sheet 60 are provided as heat-releasing paths of heat generated by the controller 20. Thus, the heat-releasing performance of the semiconductor memory device 10 can be increased.

Moreover, with the configuration in which the ball electrodes 74 provided on the lower surface of the wiring substrate 70 are connected to the heat-releasing sheet 60, heat generated by the controller 20 can be discharged to a mounting substrate in which the semiconductor memory device 10 is mounted, and accordingly, the heat-releasing performance can be further increased.

[Semiconductor Device Manufacturing Method]

A method of manufacturing the semiconductor memory device 10 will be described below as an example of a semiconductor device manufacturing method according to the present invention.

Figure 4:
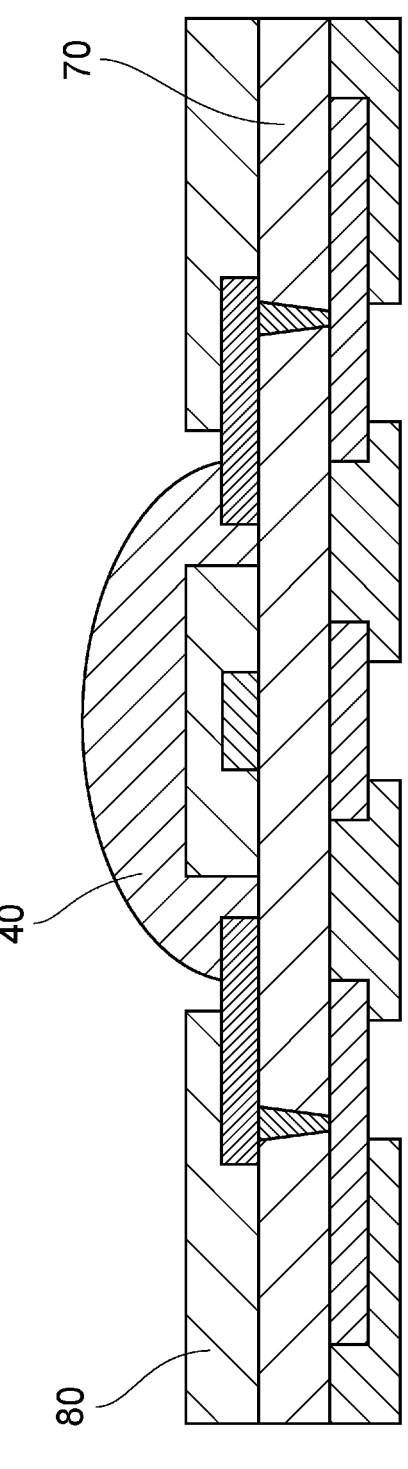
FIG. 4 is a schematic diagram illustrating a process of manufacturing the semiconductor device according to the embodiment.

FIG. 4 is a schematic diagram illustrating a process of manufacturing the semiconductor memory device 10. As illustrated in FIG. 4, the liquid underfill 40 (non-conductive paste) yet to be cured is dropped on the upper surface of the wiring substrate 70 on which a wiring pattern is formed.

Subsequently, the heat-releasing sheet 60 is stacked on a film assist bonding (FAB) film 90. The FAB film 90 is a film for preventing upward movement of the underfill 40 at flip-chip bonding.

Figures 5A, 5B:
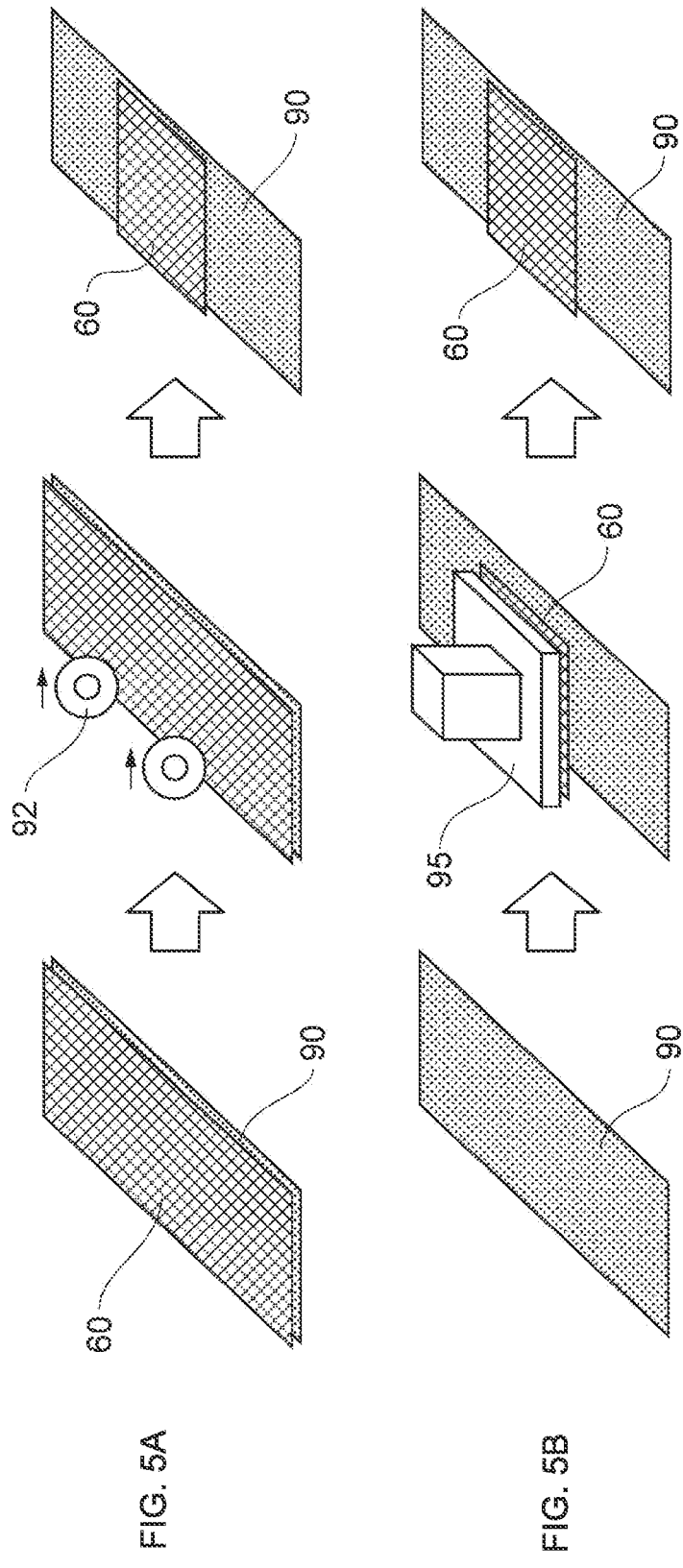
FIGS. 5A and 5B are schematic diagrams illustrating processes of providing the heat-releasing sheet on a FAB film in the embodiment.

FIGS. 5A and 5B are schematic diagrams illustrating processes of providing the heat-releasing sheet 60 on the FAB film 90. As illustrated in FIG. 5A, the heat-releasing sheet 60 may be cut into a desired shape by using a cutting jig 92 after the heat-releasing sheet 60 is stacked on the FAB film 90. Alternatively, as illustrated in FIG. 5B, the heat-releasing sheet 60 that is cut into a desired shape may be stacked on the FAB film 90 by using a mounting jig 95. Note that the heat-releasing sheet 60 has a thickness of, for example, 10 to 30 μm.

Figure 6:
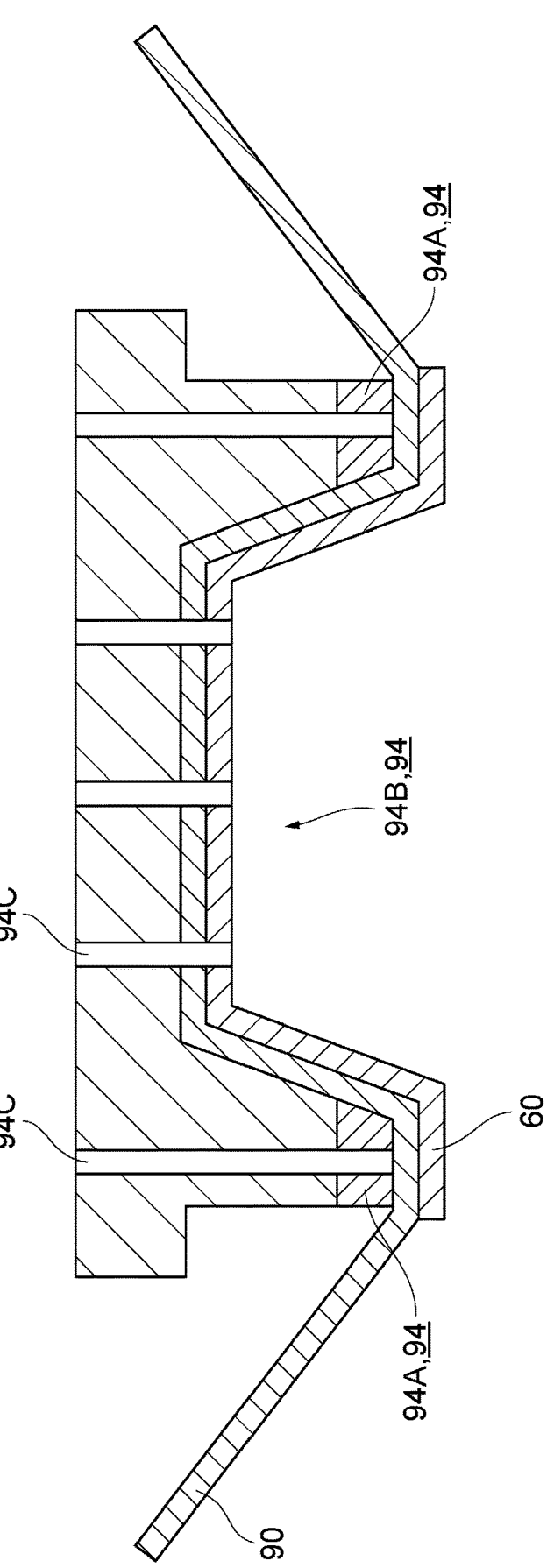
FIG. 6 is a schematic diagram of an attachment used for flip-chip bonding in the embodiment.

FIG. 6 is a schematic diagram of the attachment 94 for flip-chip bonding. As illustrated in FIG. 6, a stacked body of the FAB film 90 and the heat-releasing sheet 60 is set on a front surface of the attachment 94 for flip-chip bonding.

As illustrated in FIG. 6, the attachment 94 is provided with an end part 94A and a recessed part 94B formed as a recess from the end part 94A. The end part 94A corresponds to a site protruding downward most from the attachment 94 and is formed in a rectangular shape surrounding the recessed part 94B in a back view. The end part 94A is formed of an elastic member having elasticity, and the recessed part 94B is formed of, for example, a ceramic having stiffness. The attachment 94 is further provided with an adsorption hole 94C through which a front surface of the end part 94A communicates with an upper surface, and another adsorption hole 94C through which a front surface of the recessed part 94B communicates with the upper surface.

The controller 20 is disposed face-down in the recessed part 94B of the attachment 94 and pressed against the wiring substrate 70 with the front surface of the end part 94A and the front surface of the recessed part 94B being opposite to the upper surface of the wiring substrate 70, and accordingly, is flip-chip bonded to the wiring substrate 70. Simultaneously with the flip-chip bonding by which the plurality of bump electrodes (examples of mounting terminals such as copper pillar bump electrodes) formed on the lower surface of the controller 20 are connected to the wiring 76 (including electrodes) of the wiring substrate 70, the heat-releasing sheet 60 positioned at the end part 94A of the attachment 94 is pressed against the openings 80A formed through the solder resist 80, and accordingly, the heat-releasing sheet 60, which is adhesive, is connected to the first wiring parts 76A through the openings 80A. The underfill 40 is extruded by the heat-releasing sheet 60 and shaped in accordance with the shape of the heat-releasing sheet 60 to the recessed part 94B of the attachment 94.

Thereafter, the underfill 40 is cured by heating. The underfill 40 is cured in accordance with the shape of the recessed part 94B of the attachment 94 and thus can be formed to include the shoulder portion as described above. Accordingly, the controller 20 and the memory 30 can be stably supported. FIG. 2 schematically illustrates a configuration when the controller 20 is flip-chip bonded to the wiring substrate 70.

Thereafter, the spacers 32 is disposed on the wiring substrate 70 through a known process, and then the lower surface of the DAF 36, to the upper surface of which the memory 30 is bonded, is bonded to the upper surface of the spacer 32 and the upper surface of the heat-releasing sheet 60, and accordingly, the memory 30 is stacked on the controller 20. Then, an electrode provided on the upper surface of the memory 30 and an electrode of the wiring substrate 70 are connected to each other by wire bonding through the wire 38. Note that the second and subsequent memories 30 may be stacked.

Lastly, the memory 30 is sealed by the molding resin 50. The molding resin 50 reaches to an outer surface of the heat-releasing sheet 60 through the spacers 32.

The semiconductor memory device 10 having high heat-releasing performance can be manufactured through the processes described above. Moreover, the shape of the underfill 40 can be controlled in accordance with the shape of the recessed part of the attachment 94.

Second Embodiment

A semiconductor memory device 110 according to a second embodiment will be described below. Note that, any part that the skilled person in the art can understand has a configuration identical or similar to a configuration disclosed in other embodiments including the first embodiment is denoted by the same or similar reference sign and description thereof is omitted, and any difference will be mainly described below.

Figure 7:
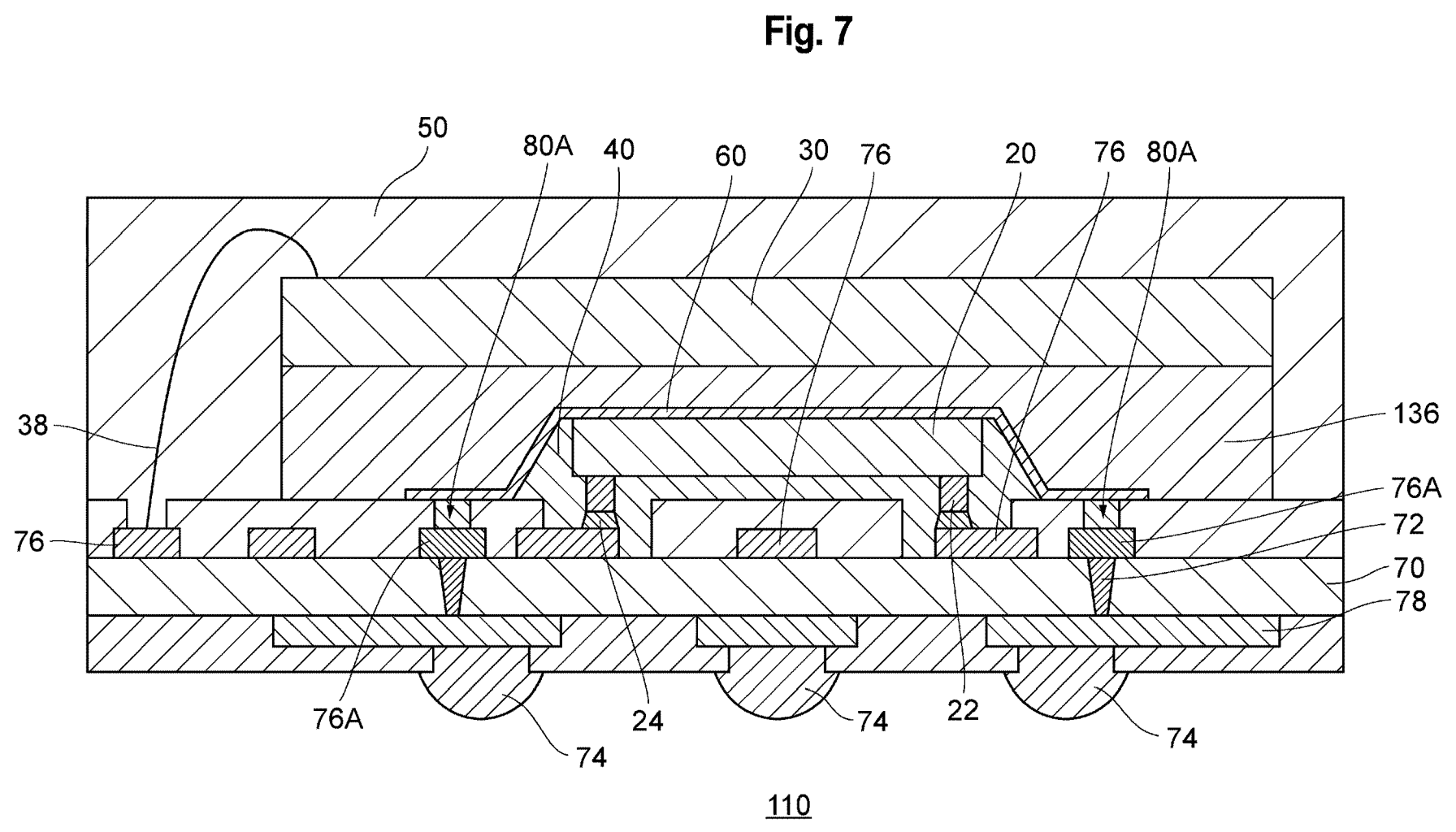

FIG. 7 is a schematic diagram illustrating a section of the semiconductor memory device 110 in a side view.

The semiconductor memory device 110 is the same as the semiconductor memory device 10 according to the first embodiment for the configuration in which the semiconductor memory device includes the wiring substrate 70 on which the wiring 76 is formed, the controller 20 flip-chip bonded to the wiring substrate 70, the memory 30 provided on the controller 20, the underfill 40 provided in a region including the region between the controller 20 and the wiring substrate 70, and the heat-releasing sheet 60 provided on the underfill 40. The semiconductor memory device 110 is the same as the semiconductor memory device 10 also for the configuration in which the heat-releasing sheet 60 is provided so that part thereof overlaps with at least part of the upper surface of the controller 20 in a top view and another part thereof overlaps with the first wiring parts 76A as part of the wiring 76 in a top view.

However, although the semiconductor memory device 10 employs a spacer structure in which the memory 30 is supported by the spacers 32, the semiconductor memory device 110 employs a film-on-die (FOD) structure in which the controller 20 is embedded in a thick DAF 136 (an example of "second resin"), which is a difference.

Specifically, the semiconductor memory device 110 includes the DAF 136 provided in the region between the memory 30 and the wiring substrate 70 in addition to the above-described configuration, and the heat-releasing sheet 60 is provided between the DAF 136 and the underfill 40. The DAF 136 may overlap with the entire memory 30 in a top view. The area of the DAF 136 may be larger than the area of the memory 30 in a top view.

Thus, the molding resin 50 is provided to seal a region around the memory 30 and outside the DAF 136.

Note that FIG. 7 also illustrates the wire 38 connecting an electrode provided on the upper surface of the memory 30 and the wiring 76 of the wiring substrate 70.

In the semiconductor memory device 110 having the above-described configuration, as well, the first heat-releasing path through the bump electrodes formed on the lower surface of the controller 20 and the second heat-releasing path through the heat-releasing sheet 60 are provided as heat-releasing paths of heat generated by the controller 20. Thus, the heat-releasing performance of the semiconductor memory device 10 can be increased.

Description is omitted for any part that has a configuration same as in another embodiment and exerts the same technological effect. Such omission of description also applies to other embodiments as well.

Note that the semiconductor devices disclosed in the first embodiment and the second embodiment may be modified as described below.

Resins provided on the inside and outside of the heat-releasing sheet 60 may be made of the same material. For example, the dropping amount of the underfill 40 may be adjusted so that the underfill 40 moves upward on the outside of the heat-releasing sheet 60 at flip-chip bonding, thereby achieving a configuration in which the inside resin (an example of "first resin") and the outside resin (an example of "second resin") are made of the same material.

Alternatively, an insulator different from a resin may be provided on the outside of the heat-releasing sheet 60. For example, a semiconductor device may be provided so that air fills the outside of the heat-releasing sheet 60. With such a configuration as well, it is possible to provide a semiconductor device having an increased heat-releasing effect by using the heat-releasing sheet 60 or any other material having a thermal conductivity equal to or higher than 10 W/m·K.

The heat-releasing sheet 60 does not necessarily need to cover the entire upper surface of the controller 20. For example, a member having a strip shape of a width shorter than the long and short sides of the upper surface of the controller 20 may be provided in place of the heat-releasing sheet 60 to connect part of the upper surface of the controller 20 to the first wiring parts 76A and the like. With such a configuration as well, a resin can be provided inside such a heat-releasing member, and thus resins provided on the inside and outside of the heat-releasing member can be made of the same material.

Note that a configuration corresponding to the heat-releasing sheet may be provided by sputtering or the like. For example, the controller 20, the underfill 40, the first wiring parts 76A may be continuously connected and a metal film may be deposited with the other part being hidden by a metal mask or the like, thereby providing a configuration corresponding to the heat-releasing sheet. Masking may be provided by a photoresist for photolithography in place of a metal mask. Alternatively, a metal film may be deposited on the entire surface and then an unnecessary part may be deleted by wet etching or dry etching.

Third Embodiment

A semiconductor memory device 210 according to a third embodiment will be described below. Note that, any part that the skilled person in the art can understand has a configuration identical or similar to a configuration disclosed in other embodiments including the first embodiment is denoted by the same or similar reference sign and description thereof is omitted, and any difference will be mainly described below.

Figure 8:
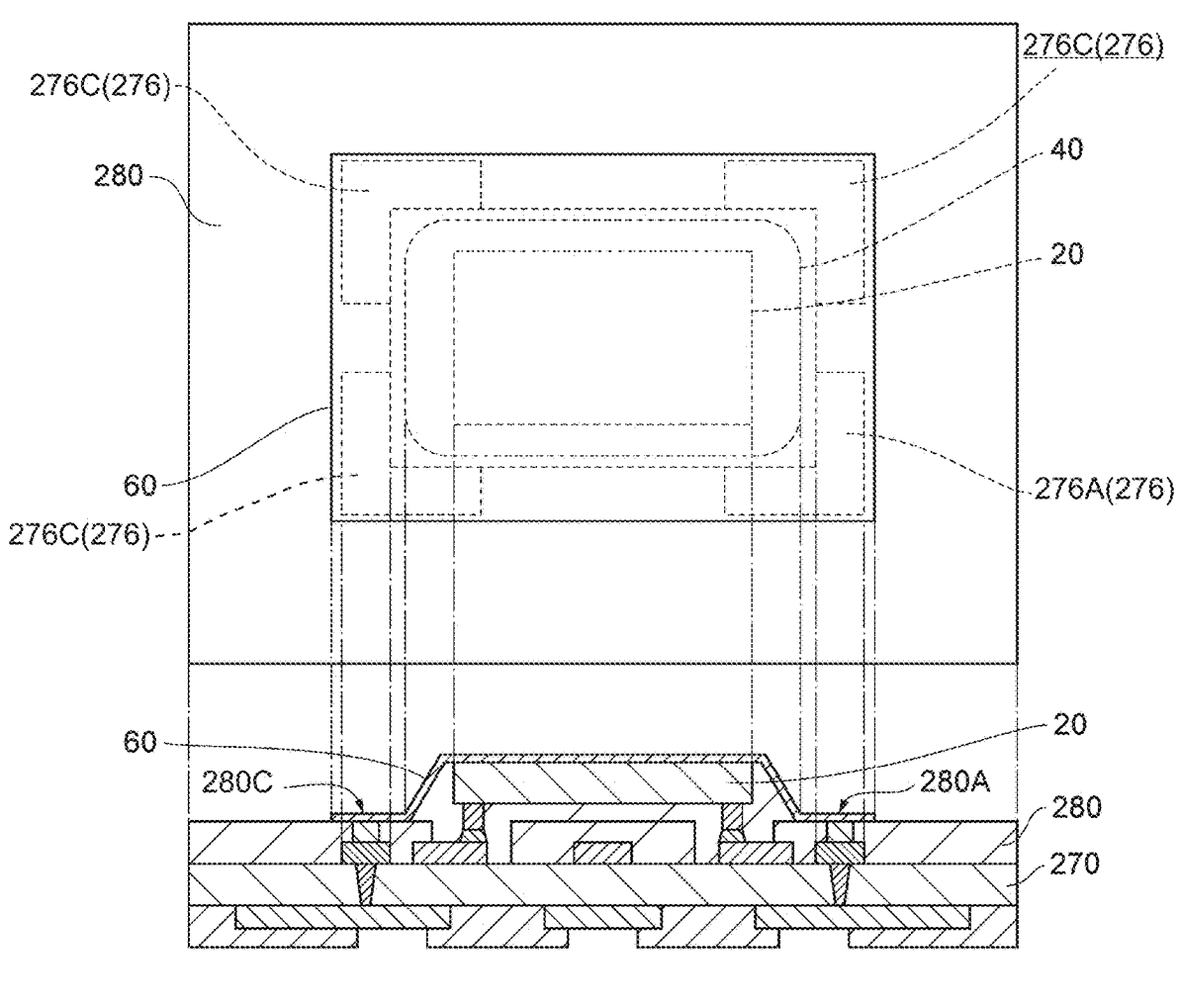
FIG. 8 is a schematic diagram illustrating sections of a configuration according to another embodiment in a top view and a side view when the first semiconductor element is flip-chip bonded to the wiring substrate.

FIG. 8 is a drawing of the semiconductor memory device 210 according to the third embodiment and is a schematic diagram illustrating cross-sectional views of the semiconductor memory device 210 in a top view and a side view when the controller 20 is flip-chip bonded to a wiring substrate 270 (an example of "substrate"). Note that the memory 30 and other components included in the semiconductor memory device 210 are omitted in the drawing. The spacer structure illustrated in FIG. 1 or the FOD structure illustrated in FIG. 7 may be employed for the configuration illustrated in FIG. 8.

The semiconductor memory device 210 is the same as the semiconductor memory device 10 according to the first embodiment for the configuration in which the semiconductor memory device includes the wiring substrate 270 on which wiring 276 is formed, the controller 20 flip-chip bonded to the wiring substrate 270, the memory 30 provided on the controller 20, and the underfill 40 provided in a region including the region between the controller 20 and the wiring substrate 70, and in addition, the heat-releasing sheet 60 is provided on the underfill 40 of the semiconductor memory device 210.

The first wiring parts 76A of the wiring 76 in the first embodiment are formed around the controller 20 in a top view as illustrated in FIG. 2. On the other hand, a first wiring part 276A of the wiring 276 in the third embodiment are formed not to surround the controller 20 in a top view as illustrated in FIG. 8. The wiring 276 further includes three third wiring parts 276C provided with separation and insulation from the first wiring part 276A.

Specifically, in a top view, the first wiring part 276A is provided outside a lower-right corner part of the controller 20 on the drawing sheet, the first third wiring part 276C is provided outside an upper-right corner part of the controller 20 on the drawing sheet, the second third wiring part 276C is provided outside an upper-left corner part of the controller 20 on the drawing sheet, and the third third wiring part 276C is provided outside a lower-left corner part of the controller 20 on the drawing sheet.

The openings 80A formed through the solder resist 80 in the first embodiment are formed around the controller 20 in regions overlapping with the first wiring parts 76A in a top view as illustrated in FIG. 2. An opening 280A formed through a solder resist 280 in the third embodiment is formed not to surround the controller 20 in a region overlapping with the first wiring part 276A in a top view as illustrated in FIG. 7. In addition, three openings 280C are formed in regions overlapping with the respective third wiring parts 276C and separated from one another.

The heat-releasing sheet 60 is connected to the first wiring part 276A through the opening 280A and connected to the third wiring parts 276C through the three openings 280C, respectively. The other peripheral part of the heat-releasing sheet 60 is connected to a solder resist 280.

In the semiconductor memory device 210 having the above-described configuration, the first heat-releasing path through the bump electrodes formed on the lower surface of the controller 20 and the second heat-releasing path through the heat-releasing sheet 60 are provided as heat-releasing paths of heat generated by the controller 20. Thus, the heat-releasing performance of the semiconductor memory device 210 can be increased.

Moreover, since the first wiring part 276A is formed not to surround the controller 20, a wiring pattern can be formed in regions as a gap between the first wiring part 276A and each third wiring part 276C and a gap between each third wiring part 276C and another third wiring parts 276C. For example, a wiring pattern for being connected with the controller 20 can be provided on an upper surface (L1) of the wiring substrate 270.

Fourth Embodiment

A semiconductor memory device 310 according to a fourth embodiment will be described below. Note that any part that the skilled person in the art can understand has a configuration identical or similar to a configuration disclosed in other embodiments including the first embodiment is denoted by the same or similar reference sign and description thereof is omitted, and any difference will be mainly described below.

Figure 9:
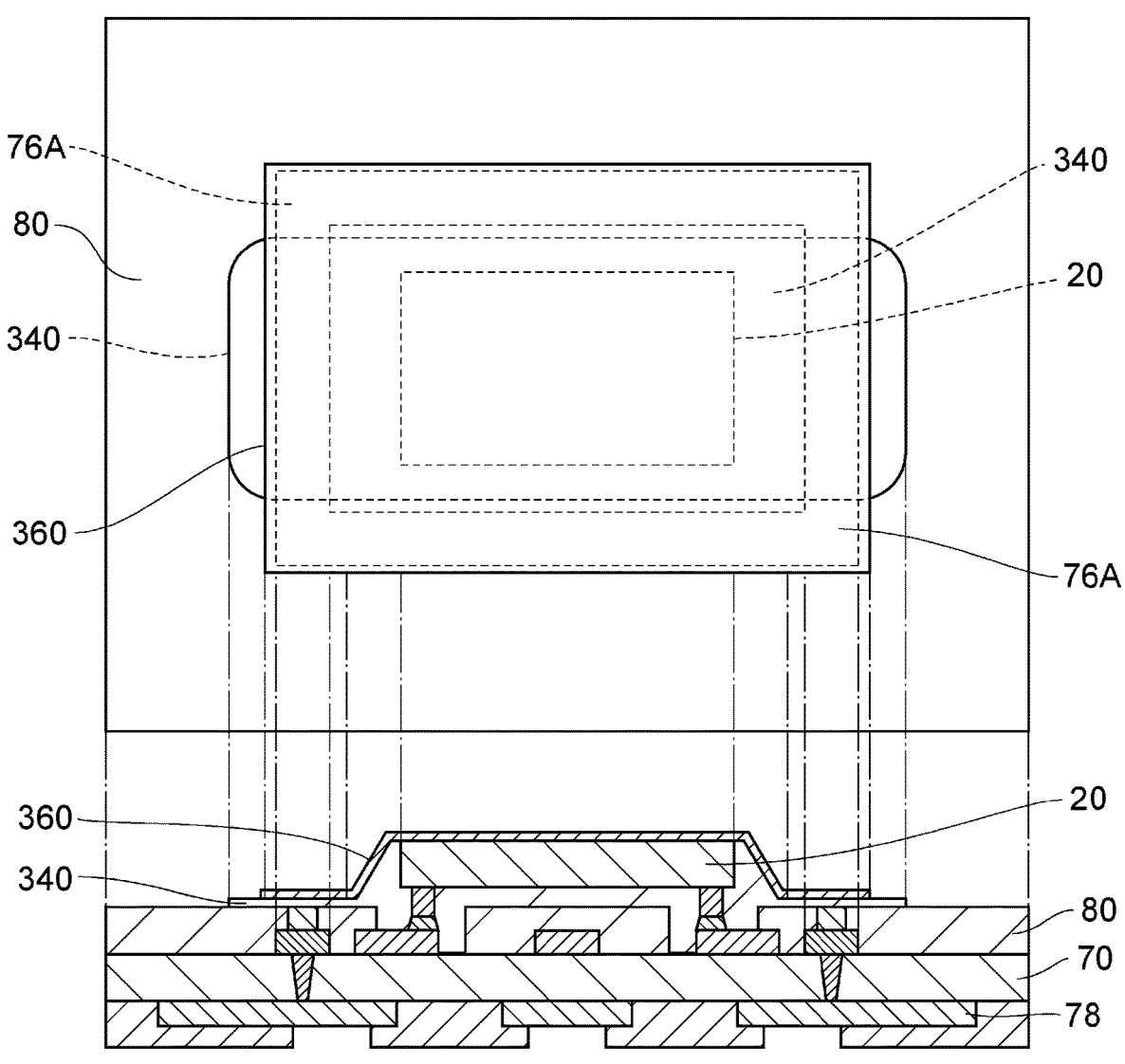
FIG. 9 is a schematic diagram illustrating sections of a configuration according to another embodiment in a top view and a side view when the first semiconductor element is flip-chip bonded to the wiring substrate.

FIG. 9 is a drawing of the semiconductor memory device 310 according to the fourth embodiment and is a schematic diagram illustrating cross-sectional views of the semiconductor memory device 310 in a top view and a side view when the controller 20 is flip-chip bonded to the wiring substrate 70. Note that the memory 30 and other components included in the semiconductor memory device 310 are omitted in the drawing. The spacer structure illustrated in FIG. 1 or the FOD structure illustrated in FIG. 7 may be employed for the configuration illustrated in FIG. 9.

The semiconductor memory device 310 is the same as the semiconductor memory device 10 according to the first embodiment for the configuration in which the semiconductor memory device includes the wiring substrate 70 on which the wiring 76 is formed, the controller 20 flip-chip bonded to the wiring substrate 70, the memory 30 provided on the controller 20, and an underfill fillet 340 (an example of "first resin"; hereinafter also referred to as an underfill 340) provided in a region including the region between the controller 20 and the wiring substrate 70, and in addition, a heat-releasing sheet 360 is provided on the underfill 340 of the semiconductor memory device 10.

However, although the heat-releasing sheet 60 is connected to the first wiring parts 76A, the heat-releasing sheet 360 of the semiconductor memory device 310 is provided above a first wiring part 76A with separation through the underfill 340, which is a difference.

In addition, although the underfill 40 is provided inside the heat-releasing sheet 60 in a top view, the underfill 340 of the semiconductor memory device 310 includes a part outside the heat-releasing sheet 360 in a top view, which is another difference. Specifically, the underfill 340 extends from the region between the controller 20 and the wiring substrate 70 to the outside of the heat-releasing sheet 360 through a region between the heat-releasing sheet 360 and the first wiring part 76A.

The heat-releasing sheet 360 of the semiconductor memory device 310 is provided between the underfill 340 and the molding resin 50 or the second resin such as the DAF 136. In a side view, the heat-releasing sheet 360 has a first height from the upper surface of the wiring substrate 70 at an upper end part provided on the upper surface of the controller 20, lowers closer to the upper surface of the wiring substrate 70 at a position closer to the first wiring part 76A, and has a second height at a lower end part corresponding to a position separated above the first wiring part 76A. The underfill 340 is also provided between the heat-releasing sheet 360 and the first wiring part 76A.

As illustrated in FIG. 9, the underfill 340 has an end part outside the heat-releasing sheet 360.

In the semiconductor memory device 310 having such a configuration, since the heat-releasing sheet 360 is provided at a position separated above the first wiring part 76A, heat of the heat-releasing sheet 360 can be transferred to the first wiring part 76A. Thus, in the semiconductor memory device 310 as well, the first heat-releasing path through the bump electrodes formed on the lower surface of the controller 20 and the second heat-releasing path through the heat-releasing sheet 60 are provided as heat-releasing paths of heat generated by the controller 20. Thus, the heat-releasing performance of the semiconductor memory device 310 can be increased.

Fifth Embodiment

A semiconductor memory device 410 according to a fifth embodiment will be described below. Note that, any part that the skilled person in the art can understand has a configuration identical or similar to a configuration disclosed in another embodiment including the first embodiment is denoted by the same or similar reference sign and description thereof is omitted, and any difference will be mainly described below.

Figure 10:
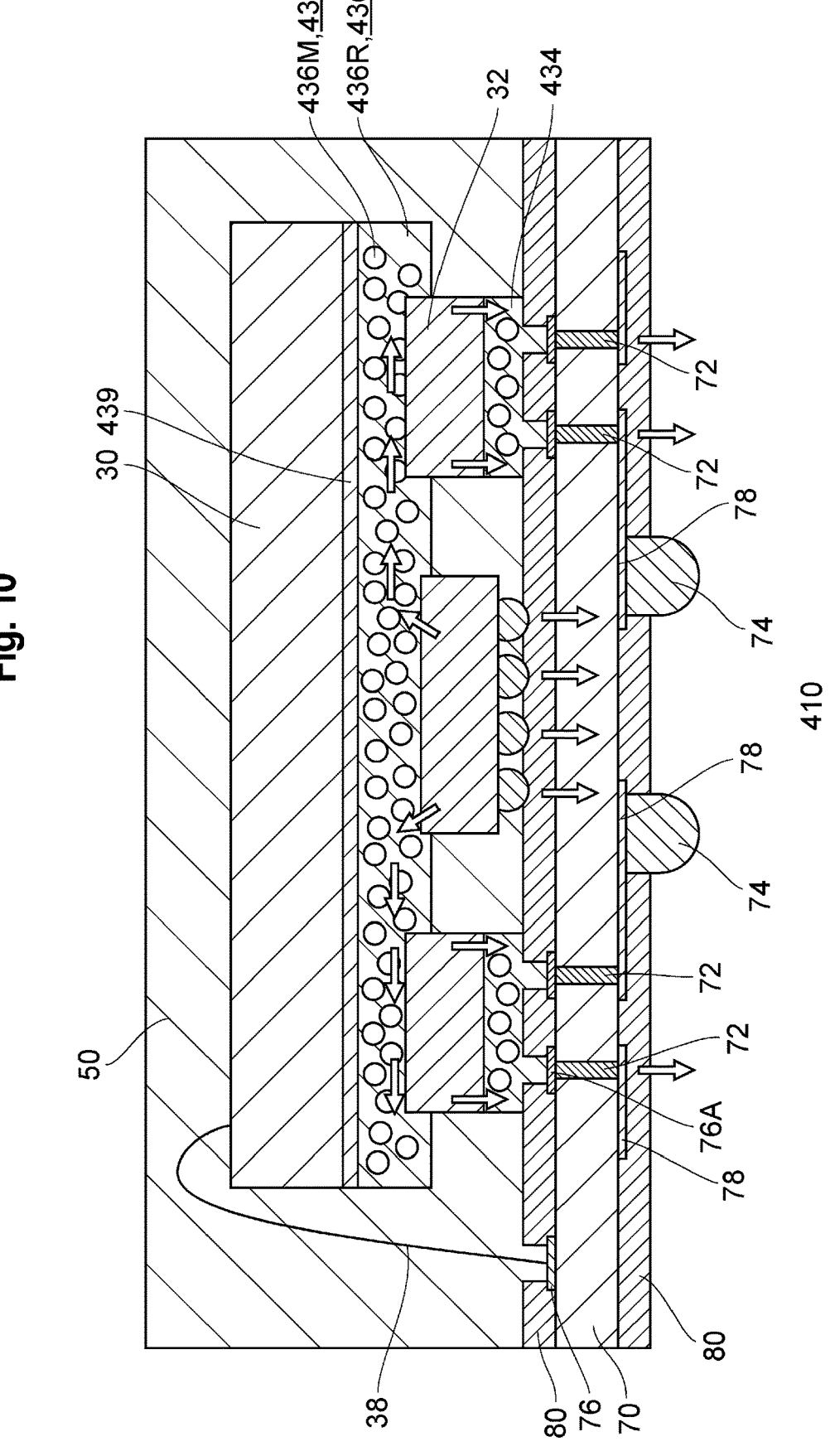
FIG. 10 is a schematic diagram illustrating a section of a semiconductor memory device 410 in a side view.

FIG. 10 is a schematic diagram illustrating a section of the semiconductor memory device 410 in a side view. FIG. 11 is a schematic diagram illustrating a process of manufacturing the semiconductor memory device 410.

The semiconductor memory device 410 is the same as the semiconductor memory device 10 for the configuration in which the semiconductor memory device includes the wiring substrate 70 on which the wiring 76 is formed, the controller 20 flip-chip bonded to the wiring substrate 70, the memory 30 provided on the controller 20, the one or a plurality of spacers 32 (examples of "first spacer") for supporting the memory 30, and the molding resin 50 provided in at least part of the region between the memory 30 and the wiring substrate 70 to seal the memory 30 and the spacers 32.

However, although the DAF 36 and the bonding film 34 of the semiconductor memory device 10 each have a thermal conductivity equal to or lower than 1 W/m·K, a thermally conductive DAF 436 (an example of "second member") and a thermally conductive bonding member 434 (an example of "first member") of the semiconductor memory device 410 each have a thermal conductivity of 1 W/m·K to 50 W/m·K inclusive, which is a difference. More preferably, the thermal conductivity is equal to or higher than 10 W/m·K. In addition, the semiconductor memory device 410 has no configuration corresponding to the heat-releasing sheet 60, which is another difference.

The thermally conductive DAF 436 is provided to discharge heat of the upper surface of the controller 20 to the upper surface of the spacer 32. Thus, the thermally conductive DAF 436 is thermally conductive and adhesive. In the present embodiment, the thermally conductive DAF 436 is made of an insulating resin and metal powder 436M of, for example, alumina contained in a resin 436R. Since alumina has a thermal conductivity of 30/m·K to 40/m·K inclusive, an insulating and thermally conductive member can be formed by mixing alumina into an adhesive resin. Similarly, an insulating and thermally conductive member can be formed by providing the thermally conductive bonding member 434.

The thermally conductive DAF 436 and the thermally conductive bonding member 434 each have a thermal conductivity higher than the thermal conductivity of the molding resin 50, which is equal to or lower than 1 W/m·K. Thus, as illustrated with arrows in FIG. 10, the second heat-releasing path for discharging heat generated by the controller 20 through the first wiring part 76A can be provided from the upper surface of the controller 20 to the wiring 76 of the wiring substrate 70 through the thermally conductive DAF 436, the spacers 32, and the thermally conductive bonding member 434.

Note that the spacers 32 are made of silicon, which has a high thermal conductivity equal to or higher than 100 W/m·K.

Moreover, in the present embodiment, since the through holes 72 are formed at positions overlapping with the spacers 32 in a top view, the heat-releasing effect can be further increased.

Furthermore, since the wiring 76 is electrically connected to the two-dimensional wiring region 78 (solid region) and the ball electrodes 74 through the through holes 72, heat can be discharged from the lower surface to the back surface of the wiring substrate 70.

The semiconductor memory device 410 according to the present embodiment further includes a bonding sheet 439 that is bonded to an upper surface of the DAF 436 and the lower surface of the memory 30.

With the bonding sheet 439 thus provided, it is possible to reduce heat transfer from the controller 20 to the memory 30.

The bonding sheet 439 is preferably made of a heat-curable resin having a bonding possible temperature lower than a bonding possible temperature of the DAF 436. With such a configuration, the bonding sheet 439 illustrated in FIG. 11A can be bonded to the memory 30 at a temperature (an example of "first temperature") lower than the bonding possible temperature of the DAF 436, and thus deformation of the DAF 436 can be prevented. Since the bonding sheet 439 is cured by heat, it is possible to prevent softening of the bonding sheet 439 when the DAF 436 illustrated in FIG. 11B is bonded to the controller 20 and the upper surface of the spacer 32 at a relatively high temperature (an example of "second temperature"). Moreover, it is possible to compensate variation in the heights of the controller 20 and the spacers 32 by using a resin with which the DAF 436 has a low viscosity when softened.

The present embodiments are described above with reference to specific examples. However, the present disclosure is not limited to these specific examples. Configurations provided by making an alteration to these specific examples by those skilled in the art, if necessary, also fall within the scope of the present disclosure as long as they have a feature of the present disclosure. The components of the above-described specific examples and the locations, conditions, shapes, etc., thereof are not limited to those described by way of example and may be altered, if necessary. The combinations of the components of the above-described specific examples may be changed, if necessary, as long as no technical inconsistency arises.

(a) For example, the DAF 36 and the bonding film 34 illustrated in FIG. 1 may be replaced with the DAF 436 and the thermally conductive bonding member 434, respectively. With such a configuration, it is possible to further increase the heat-releasing effect.

(b) For example, in the fifth embodiment, the underfill 40 may be employed, and in addition, the heat-releasing sheet 60 may be formed. In this case, the first wiring parts 76A are provided not only below the spacers 32 but also at a position overlapping with the heat-releasing sheet 60. The thermally conductive the DAF 436 and the second semiconductor element are provided on the heat-releasing sheet. With such a configuration, it is possible to further increase the heat-releasing effect.

(c)

A semiconductor device according to the present disclosure includes: a substrate on which wiring is formed; a first semiconductor element provided on the substrate; a second semiconductor element provided on the first semiconductor element; a wire connecting the second semiconductor element and the substrate; a first resin provided in at least part of a region between the first semiconductor element and the substrate; a second resin provided in at least part of a region between the second semiconductor element and the substrate; and a member having a thermal conductivity higher than the thermal conductivity of the first resin and the thermal conductivity of the second resin, provided between the first resin and the second resin, having a part overlapping with an upper surface of the first semiconductor element, and having another part overlapping with a first wiring part as part of the wiring in a top view.

(d)

A semiconductor device according to the present disclosure includes: a substrate on which wiring is formed; a first semiconductor element provided on the substrate; a second semiconductor element provided on the first semiconductor element; a first resin provided in at least part of a region between the first semiconductor element and the substrate; an insulator disposed in at least part of a region between the second semiconductor element and the substrate; and a member having a thermal conductivity higher than the thermal conductivity of the first resin and the thermal conductivity of the insulator, provided between the first resin and the insulator, having a part overlapping with an upper surface of the first semiconductor element, and having another part overlapping with a first wiring part as part of the wiring in a top view.

(e)

A semiconductor device according to the present disclosure includes: a substrate on which wiring is formed; a first semiconductor element provided on the substrate and having a lower surface on which an electrode is provided, the electrode being connected to the substrate; a second semiconductor element that is provided on the first semiconductor element, is larger than the first semiconductor element in a top view, and has a heat generation amount smaller than a heat generation amount of the first semiconductor element; a wire connecting an upper surface of the second semiconductor element and the substrate; an underfill that seals the electrode in a region between the first semiconductor element and the substrate; a second resin disposed in a region between the second semiconductor element and the substrate; a member having a thermal conductivity equal to or higher than 10 W/m·K, provided between the underfill and the second resin, having a part overlapping with an upper surface of the first semiconductor element, and having another part overlapping with a first wiring part as part of the wiring in a top view, the part being connected to the upper surface of the first semiconductor element at a position of a first height from an upper surface of the substrate in a side view, the other part being provided on the first wiring part at a position of a second height lower than the first height from the upper surface of the substrate in a side view.

What is claimed is:

1. A semiconductor device comprising:
   a substrate on which wiring is formed;
   a first semiconductor element provided on or above the substrate;
   a second semiconductor element provided on or above the first semiconductor element;
   a first resin provided in at least part of a region between the first semiconductor element and the substrate, the first resin being an underfill resin;
   a second resin different from the first resin and provided in at least part of a region between the second semiconductor element and the substrate, the second resin being a mold resin;
   a member having a thermal conductivity higher than a thermal conductivity of the first resin and a thermal conductivity of the second resin, provided between the first resin and the second resin, having a part overlapping with and directly contacting an upper surface of the first semiconductor element, having another part overlapping with a first wiring part as part of the wiring in a top view, including a through hole in the part overlapping with the upper surface of the first semiconductor element, and including no through hole in a part contacting with the second resin; and a third resin provided between the second semiconductor element and the member, wherein:

the first resin is in direct contact with an upper surface of the substrate, a lower surface of the first semiconductor element, and the member, and the third resin is a die attach film that is different from the first resin and the second resin.

2. The semiconductor device according to claim 1, wherein the member connects the upper surface of the first semiconductor element and the first wiring part.

3. The semiconductor device according to claim 2, further comprising a solder resist provided on the wiring, wherein the member is connected to the first wiring part through at least one opening formed through the solder resist.

4. The semiconductor device according to claim 1, further comprising a solder resist provided on the wiring, wherein the member is formed on the first wiring part to block at least one opening formed through the solder resist.

5. The semiconductor device according to claim 4, wherein the first resin extends from the region between the first semiconductor element and the substrate to outside of the member through a region between the first wiring part and the member.

6. The semiconductor device according to claim 1, wherein the substrate is further provided with an electrode formed on a lower surface, and a second wiring part connecting the electrode and the first wiring part.

7. The semiconductor device according to claim 1, wherein the first wiring part surrounds the first semiconductor element in a top view.

8. The semiconductor device according to claim 1, wherein the wiring further includes a third wiring part formed with insulation from the first wiring part, and the member is further connected to the third wiring part.

9. The semiconductor device according to claim 1, wherein the member is insulating.

10. The semiconductor device according to claim 1, wherein the member includes a resin that is insulating, and metal powder contained in the resin.

11. The semiconductor device according to claim 1, wherein the thermal conductivity of the member is equal to or higher than 10 W/m·K.

12. The semiconductor device according to claim 1, wherein the second resin has a different material composition from the first resin.

13. The semiconductor device according to claim 1, wherein the member includes a plurality of through holes, at least in the part overlapping with the upper surface of the first semiconductor element.

14. The semiconductor device according to claim 1, further comprising a plurality of spacers provided on or above the substrate and below the second semiconductor element, wherein the third resin is provided between the second semiconductor element and the member and between the second semiconductor element and each of the plurality of spacers.

* * * * *